United States Patent
Lu et al.

(10) Patent No.: US 11,893,547 B2
(45) Date of Patent: Feb. 6, 2024

(54) INTELLIGENT RELIABILITY EVALUATION AND SERVICE LIFE PREDICTION METHOD FOR KILOMETER DEEP WELL HOIST BRAKE

(71) Applicant: China University of Mining and Technology, Jiangsu (CN)

(72) Inventors: Hao Lu, Jiangsu (CN); Zhencai Zhu, Jiangsu (CN); Yuxing Peng, Jiangsu (CN); Gongbo Zhou, Jiangsu (CN); Gang Shen, Jiangsu (CN); Yu Tang, Jiangsu (CN); Xiang Li, Jiangsu (CN); Wei Wang, Jiangsu (CN)

(73) Assignee: China University of Mining and Technology, Jiangsu (CN)

( * ) Notice: Subject to any disclaimer, the term of this patent is extended or adjusted under 35 U.S.C. 154(b) by 0 days.

(21) Appl. No.: 17/919,285

(22) PCT Filed: Feb. 23, 2021

(86) PCT No.: PCT/CN2021/077365
§ 371 (c)(1),
(2) Date: Oct. 17, 2022

(87) PCT Pub. No.: WO2022/105072
PCT Pub. Date: May 27, 2022

(65) Prior Publication Data
US 2023/0169471 A1    Jun. 1, 2023

(30) Foreign Application Priority Data
Nov. 19, 2020  (CN) .......................... 202011299077.5

(51) Int. Cl.
*G06F 30/23* (2020.01)
*G06Q 10/20* (2023.01)

(52) U.S. Cl.
CPC ............. *G06Q 10/20* (2013.01); *G06F 30/23* (2020.01)

(58) Field of Classification Search
CPC ...................................................... G06F 30/23
See application file for complete search history.

(56) References Cited

U.S. PATENT DOCUMENTS

| | | | |
|---|---|---|---|
| 2020/0042659 A1* | 2/2020 | Tallman | ................. G06F 30/23 |
| 2020/0265329 A1 | 8/2020 | Thomsen et al. | |
| 2021/0155325 A1* | 5/2021 | Knezevic | ............... G06Q 10/04 |

FOREIGN PATENT DOCUMENTS

| | | | | |
|---|---|---|---|---|
| AU | 2017396541 B9 * | 9/2019 | ............ | G06F 17/18 |
| CN | 107291989 | 10/2017 | | |

(Continued)

OTHER PUBLICATIONS

Youtube Video: "Flow-based AI methods for hoist brake health monitoring by Miika Valtonen and Valtteri Peltoranta". Channel: "Aalto University Industrial Internet Campus AIIC". Dec. 3, 2019. URL: youtu(dot)be/FRBVK3LPzKw—see the 0 to 5 minute timeframe, see all of the slides of the slideshow. (Year: 2019).*

(Continued)

*Primary Examiner* — David A Hopkins
(74) *Attorney, Agent, or Firm* — JCIPRNET

(57) ABSTRACT

An intelligent reliability evaluation and service life prediction method for a kilometer deep well hoist brake, the method including: the establishment of a digital twin model for a hoist brake, data acquisition and synchronization, and reliability evaluation and service life prediction, wherein the digital twin model for the hoist brake can accurately reflect actual physical characteristics of the hoist brake, the data acquisition and synchronization can realize real-time mapping between a physical entity of the hoist brake and the digital twin model therefor, and furthermore, on the basis of the digital twin model for the hoist brake, the reliability (Continued)

evaluation and service life prediction are realized. Digital twin technology is combined with a reliability analysis method, so that real-time updating of reliability evaluation and service life prediction of the hoist brake are realized.

9 Claims, 2 Drawing Sheets

(56) References Cited

FOREIGN PATENT DOCUMENTS

| CN | 111737811 | 10/2020 |
|---|---|---|
| CN | 111950133 | 11/2020 |

OTHER PUBLICATIONS

Miika Valtonen, Slideshow "Flow based AI Methods for Hoist Brake Health Monitoring", Nov. 2019, accessed via URL: www(dot)aalto(dot)fi/en/industrial-internet-campus/digitwin-demo-day-22112019—see slides 1-12 (Year: 2019).*

Tuegel, Eric J., et al. "Reengineering aircraft structural life prediction using a digital twin." International Journal of Aerospace Engineering 2011 (2011). See the abstract and figures 1-2 and § 3 (Year: 2011).*

Ren, Fengbin, et al. "The probabilistic modeling and reliability analysis of brake shoes for hoist disc brake with correlated failure modes." Advances in Mechanical Engineering 12.6 (2020): 1687814020934596. See the abstract and p. 2, col. 1, see figure 9 (Year: 2020).*

Ren, Fengbin; et al., "Reliability Analysis of Disc Brake Shoe of Kilometer Deep Well Hoist," Coal Mine Machinery, vol. 41, No. 1, Jan. 2020, pp. 62-65.

"International Search Report (Form PCT/ISA/210) of PCT/CN2021/077365," dated Aug. 17, 2021, with English translation thereof, pp. 1-4.

"Written Opinion of the International Searching Authority (Form PCT/ISA/237) of PCT/CN2021/077365," dated Aug. 17, 2021, with English translation thereof, pp. 1-6.

* cited by examiner

INTELLIGENT RELIABILITY EVALUATION AND SERVICE LIFE PREDICTION METHOD FOR KILOMETER DEEP WELL HOIST BRAKE

CROSS-REFERENCE TO RELATED APPLICATION

This application is a 371 of international application of PCT application serial no. PCT/CN2021/077365, filed on Feb. 23, 2021, which claims the priority benefit of China application no. 202011299077.5, filed on Nov. 19, 2020. The entirety of each of the above mentioned patent applications is hereby incorporated by reference herein and made a part of this specification.

TECHNICAL FIELD

The present disclosure relates to an intelligent reliability evaluation and service life prediction method for a kilometer deep well hoist brake, which belongs to the technical field of a research on mechanical structure reliability.

RELATED ART

At present, most coal wells in China are shallow wells with a depth of 500 meters to 800 meters to the ground, whereas coal resources buried at a depth of 1000 meters to 2000 meters account for about 53% of the total reserves, and a kilometer deep well hoisting system must be adopted. Brakes are the most critical safety devices for the hoists, and serious accidents will be caused due to the failures of the brakes. However, the high speed, heavy load and large inertia brought by the kilometer deep well hoisting put forward higher requirements on the reliable braking of the hoists. Therefore, a real-time evaluation on the reliability level of the kilometer deep well hoist brakes and an accurate acquisition of the remaining life of the key components of the hoist brake are of great significance to improve the reliability of the hoist braking process, reduce the occurrence of malignant accidents, and avoid casualties or device damage, and so on.

The braking process of the hoist is complex and changeable, and the thermal structural coupling effect of the brake under high-speed and heavy load conditions is more likely to cause qualitative changes in the material properties of braking components. And the hoist braking system inevitably has a variety of performance degradation mechanisms closely related to wear, material aging and so on, thereby leading to a variety of failure modes of the brake. At present, the technology on the intelligent reliability evaluation and life prediction for the kilometer deep well hoist brake is not mature enough. In the service process of the brake, the brake will bear the effects of different braking speeds, braking times and braking temperatures under the conditions of a normal braking and an emergency braking. The structural parameters, material parameters and performance parameters of the key components of the brake also have uncertainness and time-varying characteristics. The coexistence of multiple failure modes also increases the complexity of reliability evaluation, and it will be difficult to accurately evaluate the reliability level and remaining service life of the hoist brake due to ignoring the influence of these factors.

SUMMARY OF INVENTION

The technical problems to be solved by the present disclosure are to provide an intelligent reliability evaluation and service life prediction method for a kilometer deep well hoist brake, which can overcome the problem of the safety braking for the kilometer deep well hoist brake under small samples and multiple failure modes, thereby improving efficiencies of the actual work.

In order to solve the above technical problems, the following technical solutions are adopted in the present disclosure. Provided in the present disclosure is an intelligent reliability evaluation and service life prediction method for a kilometer deep well hoist brake, which is used for an intelligent the reliability evaluation on a target hoist brake. A digital twin model corresponding to the target hoist brake is obtained through following Steps i to ii, and then following Steps A to H are performed in accordance with a first preset period duration based on the digital twin model, to implement a real-time reliability evaluation on the target hoist brake.

In Step i, a three-dimension-structural finite element simulation model corresponding to the target hoist brake is established according to structural parameters, material attribute parameters and braking condition parameters of the target hoist brake, in combination with physical action relations among a brake disc, a brake gate valve and a belleville spring, and then Step ii is entered.

In Step ii, parameters for the three-dimension-structural finite element simulation model and the physical action relations among the brake disc, the brake gate valve and the belleville spring spring are adjusted to obtain the digital twin model corresponding to the target hoist brake, based on a specified normal braking condition and a specified emergency braking condition, according to a difference of braking torques, generated by a contact between the brake gate valve and the brake disc, of the target hoist brake and the three-dimension-structural finite element simulation model.

In Step A, data for the target hoist brake corresponding to each specified structural parameter, each specified material attribute parameters, and each specified braking working condition parameter, and data for the target hoist brake corresponding to each specified braking performance parameter are obtained by a detection, the data for the said parameters are mapped into the digital twin model, to implement a synchronous updating with corresponding data in the digital twin model, and enter Step B is entered.

In Step B, a group of random data for the corresponding parameters of the digital twin model is established for each structural parameter, each material attribute parameter and each braking working condition parameter respectively. The distribution of the group of the random data satisfies a probability distribution of the target hoist brake obtained in Step A corresponding to the structural parameters, the material attribute parameters and the braking working condition parameters. Further, combinations of different random data among the structural parameters, the material attribute parameters and the braking working condition parameters are obtained, that is, groups of combined random parameters corresponding to the digital twin model are formed, and then Step C is entered.

In Step C, random responses to the braking performance parameters in the digital twin model corresponding to the groups of the combined random parameters respectively under each specified working condition are obtained for the specified normal braking working condition and the specified emergency braking working condition respectively, and then Step D is entered.

In Step D, for each braking performance parameter respectively, according to the random responses to the braking performance parameters in the digital twin model corresponding to the groups of the combined random parameters respectively under each specified working condition, the groups of the combined random parameters are taken as an input, and the braking performance parameters corresponding to the groups of the combined random parameters respectively are taken as an output, to construct a training data sample libraries corresponding to the braking performance parameters, and then Step E is entered.

In Step E, for each braking performance parameter respectively, according to the training data sample libraries corresponding to the braking performance parameters, model functions corresponding to the braking performance parameters respectively that is, random response surface models corresponding to the braking performance parameters respectively are constructed, and then Step F is entered.

In Step F, according to the random response surface models corresponding to the braking performance parameters respectively, in combination with a threshold value for each braking performance parameter corresponding to the target hoist brake, reliability evaluation models corresponding to the braking performance parameters respectively are established, and then Step G is entered.

In Step G, for the data for the braking working condition parameters obtained by detecting the target hoist brake, according to the reliability evaluation models corresponding to the braking performance parameters respectively, a statistical moment analysis is performed by adopting a knowable moment, further a high-order moment approximation method based on the knowable moment is adopted to obtain reliability results corresponding to the braking performance parameters respectively, that is, to implement the real-time reliability evaluation on the target hoist brake, and then Step H is entered.

In Step H, the data for the target hoist brake corresponding to the specified braking working condition parameters and the data for the target hoist brake corresponding to the specified braking performance parameters are obtained by a detection, the training data sample libraries taking the data for the braking working condition parameters as an input and the data corresponding to the braking performance parameters as an output are constructed, and the data are correspondingly added into the training data sample libraries corresponding to the braking performance parameters respectively, and then Step E is returned.

As a preferable technical solution of the present disclosure, in Step G, after obtaining the reliability results corresponding to the braking performance parameters respectively, according to a correlation among the braking performance parameters, a copula function is applied to establish a system reliability model under a correlation of a multi-failure mode for the reliability results, that is, a comprehensive reliability result corresponding to the target hoist brake is obtained.

As a preferable technical solution of the present disclosure, based on the digital twin model, the method further includes the following Steps I to III performed according to a second preset period duration, to implement the service life prediction on the target hoist brake.

In Step I, for a preset duration range in a direction from a current time to a historical time, the data for the target hoist brake corresponding to the specified braking working condition parameters over time in the preset duration range are acquired and the data for the braking performance parameters related to performance degradation are specified, and then Step II is entered.

In Step II, for each braking performance parameter related to the performance degradation respectively, according to the data for the braking performance parameters of the target hoist brake related to the performance degradation over the time obtained in Step I, a degradation process model function corresponding to the braking performance parameters related to the performance degradation is constructed, that is, the degradation process model function is taken as a performance degradation model corresponding to the braking performance parameters related to the performance degradation; further, performance degradation models corresponding to the braking performance parameters related to the performance degradation respectively are acquired, and then Step III is entered.

In Step III, according to the performance degradation models corresponding to the braking performance parameters related to the performance degradation respectively, for the data for the braking working condition parameters obtained by detecting the target hoist brake, service life prediction results corresponding to the braking performance parameters related to the performance degradation respectively are acquired, that is, the service life prediction on the target hoist brake is implemented.

As a preferable technical solution of the present disclosure, in Step III, after the service life prediction results corresponding to the braking performance parameters related to the performance degradation are acquired, a time-varying copula function is applied to establish a life prediction model under a correlation of a multi-degradation process for each life prediction results, that is, a comprehensive life prediction result corresponding to the target hoist brake is obtained.

As a preferable technical solution of the present disclosure, in Step E, for each braking performance parameter respectively, according to a training data sample library corresponding to a braking performance parameter, a machine learning method is applied to construct a model function corresponding to the braking performance parameter, that is, a random response surface model corresponding to the braking performance parameter; further the random response surface models corresponding to the braking performance parameters are respectively obtained, and then Step F is entered.

In Step II, for the each braking performance parameter related to the performance degradation respectively, according to the data for the braking performance parameters of the target hoist brake related to the performance degradation over the time obtained in Step I, the machine learning method is applied to construct the degradation process model function corresponding to the braking performance parameters related to the performance degradation, that is, the degradation process model function corresponding to the braking performance parameters related to the performance degradation is taken as the performance degradation model corresponding to the braking performance parameters related to the performance degradation.

As a preferable technical solution of the present disclosure, the braking performance parameters related to the performance degradation include a brake disc crack, a wear on each of brake gate valve, and a stiffness of each of belleville springs.

As a preferable technical solution of the present disclosure, Step ii includes the following Steps ii-1 to ii-4.

In Step ii-1, for the specified normal braking working condition and the specified emergency braking working condition respectively, a braking torque generated by a contact between the brake gate valve and the brake disc of the target hoist brake under each of the specified normal braking working condition and the specified emergency braking working condition is obtained, and then Step ii-2 is entered.

In Step ii-2, for the specified normal braking working condition and the specified emergency braking working condition as same as those in Step ii-1 respectively, a braking torque generated by a contact between the brake gate valve and the brake disc of the three-dimension-structural finite element simulation model under each of the specified normal braking working condition and the specified emergency braking working condition is obtained, and then Step ii-3 is entered.

In Step ii-3, for a difference between the braking torque corresponding to the three-dimension-structural finite element simulation model and the braking torque corresponding to the target hoist brake under the specified normal braking working condition, as well as a difference between the braking torque corresponding to the three-dimension-structural finite element simulation model and the braking torque corresponding to the target hoist brake under the specified emergency braking working condition, whether the two differences are in a preset difference threshold range or not is determined, and if so, the digital twin model corresponding to the target hoist brake is constituted by the three-dimension-structural finite element simulation model, else, Step ii-4 is entered.

In Step ii-4, parameters of the three-dimension-structural finite element simulation model as well as the physical action relations among the brake disc, the brake gate valve and the belleville spring are adjusted according to the two differences determined in Step B3, the three-dimension-structural finite element simulation model is updated, and then Step ii-2 is returned.

As a preferable technical solution of the present disclosure, in Step A, after the data for the target hoist brake corresponding to the specified structural parameters, the specified material attribute parameters, and the specified braking working condition parameters, and the data for the target hoist brake corresponding to the specified braking performance parameters are obtained by a detection, the data for the target hoist brake corresponding to the specified structural parameters, the specified material attribute parameters, and the specified braking working condition parameters, and the data for the target hoist brake corresponding to the specified braking performance parameters are filtered respectively, and then the data for the said parameters are mapped into the digital twin model.

As a preferable technical solution of the present disclosure, the braking working condition parameters include lifting loads, an initial braking speeds, braking times and braking forces, and the braking performance parameters include a temperature of the brake disc, a temperature of the brake gate valve, a deformation of the brake disc, a wear losses of the brake gate valve and a stiffness of the belleville spring.

The intelligent reliability evaluation and service life prediction method for a kilometer deep well hoist brake according to the present disclosure has the following technical effects compared with the prior art by adopting the above technical solutions.

(1) In the intelligent reliability evaluation and service life prediction method for the kilometer deep well hoist brake provided by the present disclosure, the digital twin technology is combined with the reliability analysis method to implement the real-time update on the performance parameters for the hoist brake. Compared with the method for the reliability modeling by using the historical data or the experimental data, the present disclosure conducts modeling and statistical analysis through real-time updated parameters, thereby improving the accuracy of the reliability evaluation model and the performance degradation model.

(2) In the intelligent reliability evaluation and service life prediction method for the kilometer deep well hoist brake provided by the present disclosure, the dynamic correlation between various failure modes that affect the braking reliability is considered, the time-varying copula function is adopted to conduct the probability modeling of the dynamic correlation, and the brake reliability of the hoist brake can be more accurately and reasonably evaluated compared with the failure independent assumption.

(3) In the intelligent reliability evaluation and service life prediction method of the kilometer deep well hoist brake provided by the present disclosure, the knowable moment is adopted to conduct probability statistics on the random parameters and random responses of the hoist brake, which is more suitable for fitting the probability distribution than the traditional moment, thereby avoiding the large distribution fitting deviation caused by a small number of samples, and improving the accuracy of real-time reliability evaluation.

DESCRIPTION OF EMBODIMENTS

The specific embodiments of the present disclosure will be further described in detail below in combination with the drawings of the description.

In the digital twin technology, the physical entity of the hoist brake can be combined with its digital model through the real-time data mapping to implement the real-time update on the digital twin model of the brake, and the real environmental working conditions and performance changes of the hoist brake can be depicted through digital simulation, thereby providing an effective means of performance simulation and data analysis for the real-time reliability evaluation and service life prediction on the hoist brake.

By combining the digital twin technology with the reliability analysis method in the present disclosure, the real-time interaction and update of the simulation data and the real-time monitoring data for the brake are implemented, and the difficult problems that it is difficult to conduct reliability evaluation and service life prediction due to the difficulty for direct monitoring on some parameters, the difficulty for reliability data statistics or the lack of data samples can be solved.

Figure 1:
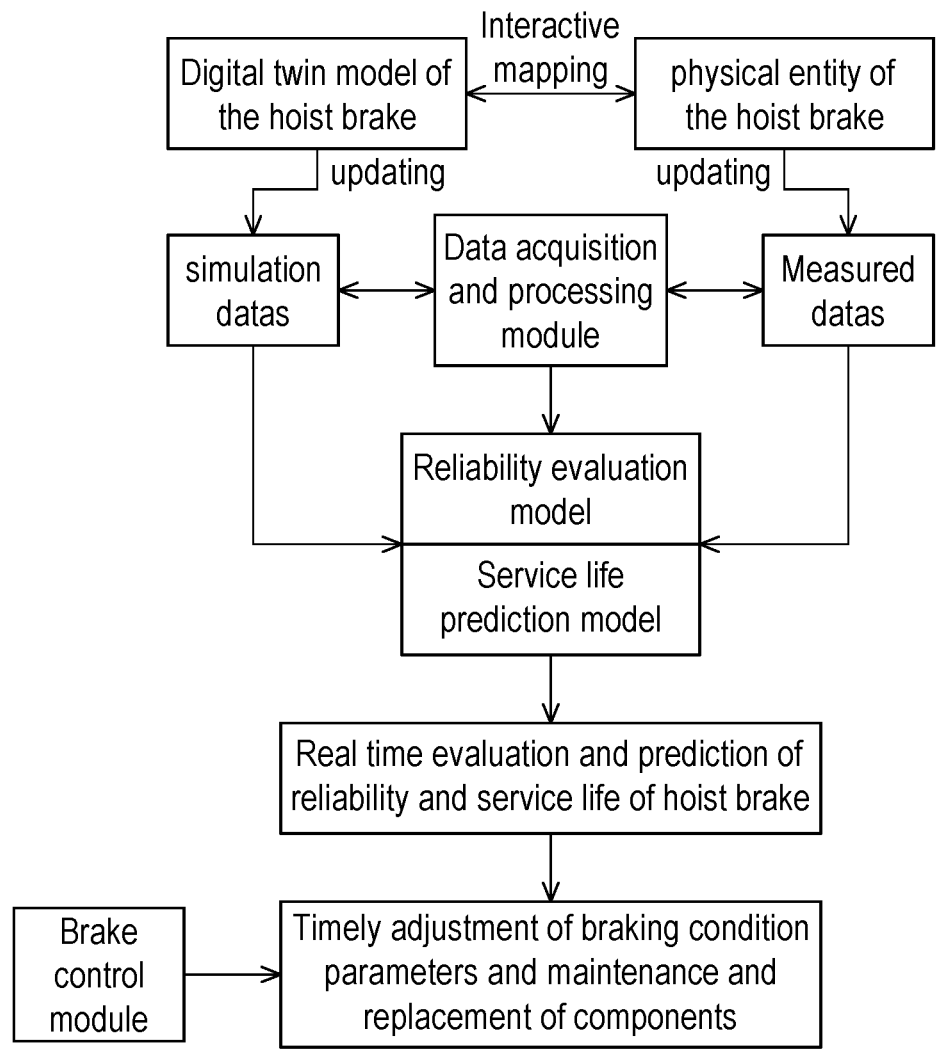
FIG. 1 illustrates a flow chart for a method of the present disclosure.

Specifically, the present disclosure provides an intelligent reliability evaluation and service life prediction method for a kilometer deep well hoist brake, which is used for an intelligent reliability evaluation on a target hoist brake. As illustrated in FIG. 1, firstly, the digital twin model corresponding to the target hoist brake is obtained through the following Steps i to ii.

In Step i, a three-dimension-structural finite element simulation model corresponding to the target hoist brake is established according to structural parameters, material attribute parameters and braking condition parameters of the target hoist brake, in combination with physical action relations among a brake disc, a brake gate valve and a belleville spring, and then Step ii is entered.

Here, in practical applications, the braking working condition parameters include lifting loads, initial braking speeds, braking times and braking forces, and the braking performance parameters include a temperature of the brake disc, a temperature of the brake gate valve, a deformation of the brake disc, a wear losses of the brake gate valve and a stiffness of the belleville spring.

In Step ii, based on a specified normal braking condition and a specified emergency braking condition, according to a difference of braking torques, generated by a contact between the brake gate valve and the brake disc, of the target hoist brake and the three-dimension-structural finite element simulation model, parameters for the three-dimension-structural finite element simulation model and the physical action relations among the brake disc, the brake gate valve and the belleville spring are adjusted to obtain the digital twin model corresponding to the target hoist brake.

Normal braking includes parking braking and working braking. Parking braking refers to that when the hoist stops running, the brake locks the hoist and enables the hoist not to rotate. Working braking refers to that when the hoist decelerates to crawl or is released under heavy load, the brake controls the lifting speed, so that the operating state of the hoist will not deviate from the predetermined requirements. The emergency braking refers to that in case of a sudden accident or an unexpected situation, the brake should be able to quickly and safely brake the hoist brake disc.

In practical applications, Step ii includes the following Steps ii-1 to ii-4.

In Step ii-1, for the specified normal braking working condition and the specified emergency braking working condition respectively, a braking torque generated by a contact between the brake gate valve and the brake disc of the target hoist brake under each of the specified normal braking working condition and the specified emergency braking working condition is obtained, and then Step ii-2 is entered.

In Step ii-2, for the specified normal braking working condition and the specified emergency braking working condition as same as those in Step ii-1 respectively, a braking torque generated by a contact between the brake gate valve and the brake disc of the three-dimension-structural finite element simulation model under each of the specified normal braking working condition and the specified emergency braking working condition is obtained, and then Step ii-3 is entered.

In Step ii-3, for a difference between the braking torque corresponding to the three-dimension-structural finite element simulation model and the braking torque corresponding to the target hoist brake under the specified normal braking working condition, as well as a difference between the braking torque corresponding to the three-dimension-structural finite element simulation model and the braking torque corresponding to the target hoist brake under the specified emergency braking working condition, whether the two differences are in a preset difference threshold range or not is determined, and if so, the digital twin model corresponding to the target hoist brake is constituted by the three-dimension-structural finite element simulation model, else, Step ii-4 is entered.

In Step ii-4, parameters of the three-dimension-structural finite element simulation model as well as the physical action relations among the brake disc, the brake gate valve and the belleville spring are adjusted according to the two differences determined in Step B3, the three-dimension-structural finite element simulation model is updated, and then Step ii-2 is returned.

In practical applications, the digital twin model corresponding to the target hoist brake obtained through the above operations includes a digital twin structure model and a digital twin relationship model, wherein the digital twin structure model includes the geometric dimensions, material attributes and working condition parameters for the hoist brake and its components. The geometric dimensions and the material attribute parameters can be obtained through the design drawings of the hoist brake, the materials selected for the components and the processing technology and other channels. The working condition parameters at least include lifting loads, initial braking speeds, braking times, braking forces, etc. The digital twin relationship model includes the assembly relationship and the positional relationship between the components of the hoist brake, and can be obtained by means of design drawings or mapping.

Then, based on the digital twin model, as illustrated in FIG. 1, the following Steps A to H are performed in accordance with a first preset cycle duration to implement a real-time reliability evaluation on the target hoist brake.

In Step A, after the data for the target hoist brake corresponding to the specified structural parameters, the specified material attribute parameters, and the specified braking working condition parameters, and the data for the target hoist brake corresponding to the specified braking performance parameters are obtained by a detection, the data for the target hoist brake corresponding to the specified structural parameters, the specified material attribute parameters, and the specified braking working condition parameters, and the data for the target hoist brake corresponding to the specified braking performance parameters are filtered respectively, and the data for the said parameters are mapped into the digital twin model to implement synchronous update with the corresponding data in the digital twin model, and then Step B is entered.

In practical applications, the multi-sensor monitoring system is adopted to monitor the braking working condition parameters and braking performance parameters for the hoist brake in real time. The information processing system is adopted to analyze and process the various parameter information collected by the multi-sensor monitoring system, and to map the processed parameters into the digital twin model corresponding to the hoist brake in real time, and to drive the real-time update of the digital twin model corresponding to the hoist brake.

Specifically, various sensors in the multi-sensor monitoring system are installed on the hoist brake system. The laser ranging sensor is adopted to measure the contour of the brake gate valve and the brake disc, an eddy current sensor is adopted to measure the thickness of the brake gate valve and the brake disc, the photoelectric displacement sensor is adopted to measure the linear displacement of the piston rod, and the oil pressure transmitter is adopted to monitor the oil pressure at the inlet of the brake hydraulic oil, the flow sensor is adopted to monitor the flow at the inlet of the brake hydraulic oil, the encoder is adopted to measure the rotation speed and angular displacement of the brake disc, and the infrared thermal imager is adopted to measure the temperatures of the brake gate valve and the brake disc.

In Step B, a group of random data for the corresponding parameters of the digital twin model is established for each structural parameter, each material attribute parameter and each braking working condition parameter respectively. The distribution of the group of the random data satisfies a probability distribution of the target hoist brake obtained in Step A corresponding to the structural parameters, the material attribute parameters and the braking working condition parameters. Further, combinations of different random data among the structural parameters, the material attribute parameters and the braking working condition parameters are obtained, that is, groups of combined random parameters corresponding to the digital twin model are formed, and then Step C is entered.

In Step C, random responses to the braking performance parameters in the digital twin model corresponding to the groups of the combined random parameters respectively under each specified working condition are obtained for the specified normal braking working condition and the specified emergency braking working condition respectively, and then Step D is entered.

In Step D, for each braking performance parameter respectively, according to the random responses to the braking performance parameters in the digital twin model corresponding to the groups of the combined random parameters respectively under each specified working condition, the groups of the combined random parameters are taken as an input, and the braking performance parameters corresponding to the groups of the combined random parameters respectively are taken as an output, to construct a training data sample libraries corresponding to the braking performance parameters, and then Step E is entered.

In Step E, for each braking performance parameter respectively, according to the training data sample libraries corresponding to the braking performance parameters, a machine learning method is applied to construct the model function corresponding to the braking performance parameter, that is, the random response surface model corresponding to the braking performance parameters; further the random response surface models corresponding to the braking performance parameters respectively are obtained, and then Step F is entered.

In Step F, according to the random response surface models corresponding to the braking performance parameters respectively, in combination with a threshold value for each braking performance parameter corresponding to the target hoist brake, reliability evaluation models corresponding to the braking performance parameters respectively are established, and then Step G is entered.

In Step G, for the data for the braking working condition parameters obtained by detecting the target hoist brake, according to the reliability evaluation models corresponding to the braking performance parameters respectively, a statistical moment analysis is performed by adopting a knowable moment, further a high-order moment approximation method based on the knowable moment is adopted to obtain reliability results corresponding to the braking performance parameters respectively, that is, to implement the real-time reliability evaluation on the target hoist brake, and then Step H is entered.

In practical applications, in Step G, after obtaining the reliability results corresponding to the braking performance parameters respectively, according to a correlation among the braking performance parameters, a copula function is applied to establish a system reliability model under a correlation of a multi-failure mode for the reliability results, that is a comprehensive reliability result corresponding to the target hoist brake is obtained.

The difference between the knowable moment and the traditional statistical moment is that the first four central moments of the knowable moment are as follows:

$$K_1 = 0, K_2 = 2\lambda_2, K_3 = 2\lambda_3, K_4 = \frac{8}{5}\lambda_4 + \frac{12}{5}\lambda_2,$$

where, $\lambda_2$, $\lambda_3$, $\lambda_4$ are the second-order moment, the third-order moment and the fourth-order moment of the L moment respectively.

Meanwhile, according to the following formula:

$$\theta = \frac{K_3}{K_2} = \frac{\lambda_3}{\lambda_2}, \eta = \frac{K_4}{K_2} = \frac{4\lambda_4}{5\lambda_2} + \frac{6}{5},$$

a skewness $\theta$ and a kurtosis $\eta$ are defined when using the knowable moment.

Figure 2:
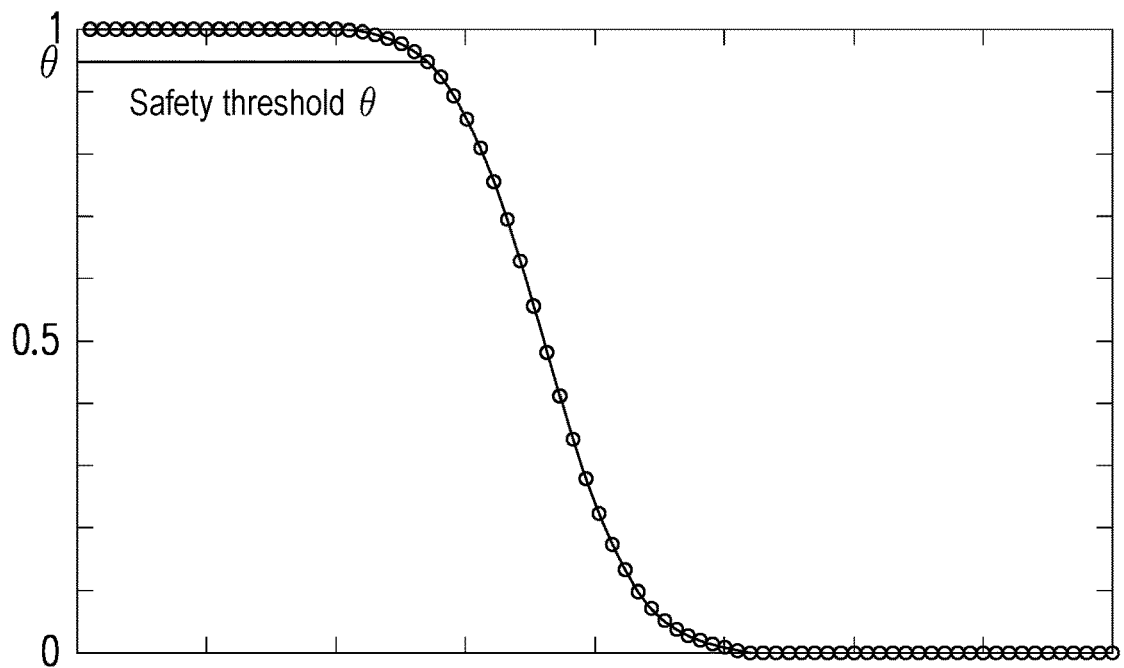
FIG. 2 illustrates a schematic diagram of a curve for evaluating reliability of a real-time system of a hoist brake.

As illustrated in FIG. 2, when the comprehensive reliability result is lower than the preset safety threshold, the braking control module of the hoist brake will timely adjust the braking working condition parameters of the hoist to improve the braking reliability.

In Step H, the data for the target hoist brake corresponding to the specified braking working condition parameters and the data for the target hoist brake corresponding to the specified braking performance parameters are obtained by a detection, the training data sample libraries taking the data for the braking working condition parameters as an input and the data corresponding to the braking performance parameters as an output are constructed, and the data are correspondingly added into the training data sample libraries corresponding to the braking performance parameters respectively, and then Step E is returned.

Corresponding to the above-mentioned intelligent reliability evaluation on the target hoist brake, as illustrated in FIG. 1, the following Steps I to III are performed in accordance with a second preset period duration further based on the digital twin model in the present disclosure, to implement the service life prediction on the target hoist brake.

In Step I, for a preset duration range in a direction from a current time to a historical time, the data for the target hoist brake corresponding to the specified braking working condition parameters over time in the preset duration range are acquired and the data for the braking performance parameters related to performance degradation are specified, and then Step II is entered. In practical applications, the braking performance parameters related to the performance degradation include a brake disc crack, a wear on brake gate valves, and a stiffness of belleville springs. degradation respectively, according to the data for the braking performance parameters of the target hoist brake related to the performance degradation over the time obtained in Step I, the machine learning method is applied to construct a degradation process model function corresponding to the braking performance parameters related to the performance degradation, that is, the degradation process model function is taken as a performance degradation model corresponding to the braking performance parameters related to the performance degradation; further, performance degradation models corresponding to the braking performance parameters related to the performance degradation respectively are acquired, and then Step III is entered.

In Step III, according to the performance degradation models corresponding to the braking performance parameters related to the performance degradation respectively, for the data for the braking working condition parameters obtained by detecting the target hoist brake, service life prediction results corresponding to the braking performance parameters related to the performance degradation respectively are acquired, that is, the service life prediction on the target hoist brake is implemented.

In practical applications, in the above step III, after life prediction results corresponding to the braking performance parameters related to performance degradation respectively are obtained, a time-varying copula function is applied to establish a life prediction model under a correlation of a multi-degradation process for each life prediction results, that is, a comprehensive life prediction result corresponding to the target hoist brake is obtained.

Figure 3:
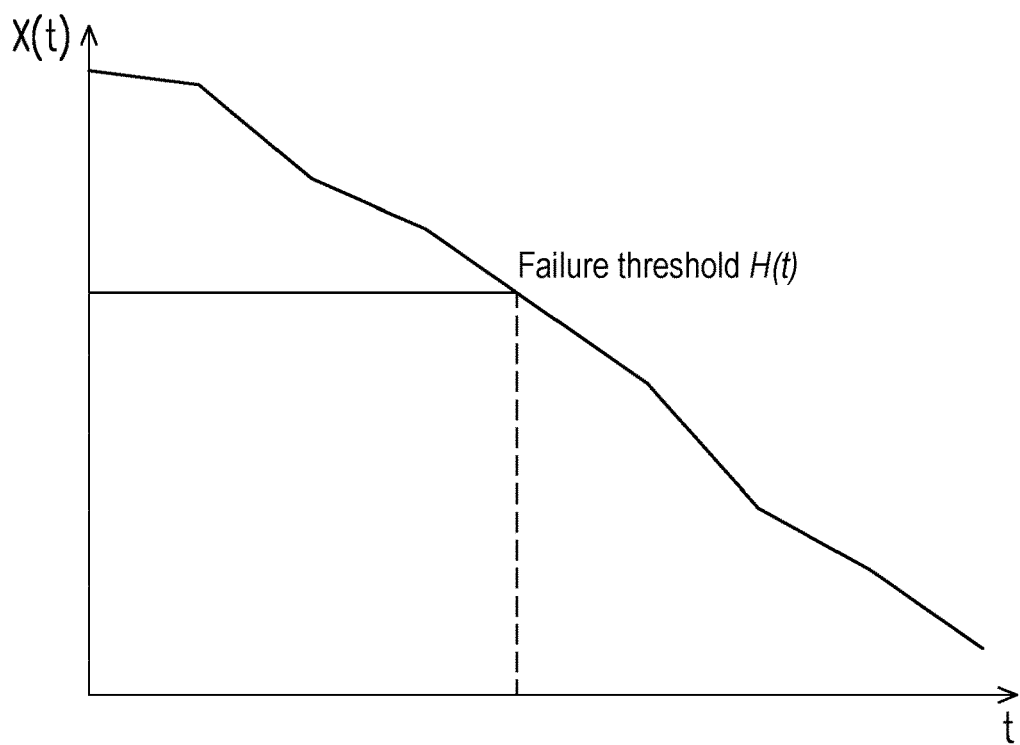
FIG. 3 illustrates a schematic diagram of a curve for predicting a residual service life of key components in the hoist brake.

As illustrated in FIG. 3, after obtaining the comprehensive service life prediction result corresponding to the target hoist brake, when the comprehensive life prediction result is lower than the preset threshold, the alarm will be given in time and the components with degraded performance will be maintained and replaced.

In the intelligent reliability evaluation and service life prediction method for the kilometer deep well hoist brake provided by the present disclosure, the digital twin technology is combined with the reliability analysis method to implement the real-time update on the performance parameters for the hoist brake. Compared with the method for reliability modeling by using the historical data or the experimental data, the present disclosure conducts modeling and statistical analysis through real-time updated parameters, thereby improving the accuracy of the reliability evaluation model and the performance degradation model. The dynamic correlation among various failure modes that affect the braking reliability is considered, the time-varying copula function is adopted to conduct the probability modeling of dynamic correlation, and the brake reliability of the hoist brake can be more accurately and reasonably evaluated compared with the failure independent assumption. In addition, the knowable moment is adopted to conduct probability statistics on the random parameters and random response of the hoist brake, which is more suitable for fitting the probability distribution than the traditional moment, thereby avoiding the large distribution fitting deviation caused by a small number of samples, and improving the accuracy of real-time reliability evaluation.

Although the embodiments of the present disclosure have been described in detail above in conjunction with the accompanying drawings, the present disclosure is not limited to the above-mentioned embodiments, various changes can also be made within the scope of knowledge possessed by those of ordinary skilled in the art without departing from the spirt of the present disclosure.

What is claimed is:

1. An intelligent reliability evaluation and service life prediction method for a kilometer deep well hoist brake, used for an intelligent reliability evaluation on a target hoist brake, comprising:
obtaining a digital twin model corresponding to the target hoist brake through following Steps i to ii;
Step i, establishing, according to structural parameters, material attribute parameters and braking working condition parameters of the target hoist brake, in combination with physical action relations among a brake disc, a brake gate valve and a belleville spring, a three-dimension-structural finite element simulation model corresponding to the target hoist brake, and then entering Step ii;
Step ii, adjusting, based on specified working conditions, the specified working conditions comprising a specified normal braking condition and a specified emergency braking condition, according to a difference of braking torques between a first braking torque generated by a first contact between the brake gate valve and the brake disc of the three-dimension-structural finite element simulation model and a second braking torque generated by a second contact between the brake gate valve and the brake disc of the target hoist brake, parameters for the three-dimension-structural finite element simulation model and the physical action relations among the brake disc, the brake gate valve and the belleville spring, to obtain the digital twin model corresponding to the target hoist brake;
and performing following Steps A to H in accordance with a first preset period duration based on the digital twin model, to implement a real-time reliability evaluation on the target hoist brake, Steps A to H comprising:
Step A, obtaining, by detecting, a first data for the target hoist brake corresponding to each of the structural parameters, each of the material attribute parameter and each of the braking working condition parameters, and a second data for the target hoist brake corresponding to each of braking performance parameters, mapping the first data and the second data into the digital twin model, to implement a synchronous updating with corresponding data in the digital twin model, and then entering Step B;
Step B, establishing, for each of the structural parameters, each of the material attribute parameters and each of the braking working condition parameters respectively, a group of random data for the corresponding data of the digital twin model, wherein a distribution of the group of the random data satisfies a probability distribution of the first data obtained in Step A;
further obtaining combinations of different random data among the structural parameters, the material attribute parameters and the braking working condition parameters, wherein the combinations are used as groups of combined random parameters corresponding to the digital twin model, and then entering Step C;
Step C, obtaining, for the specified normal braking working condition and the specified emergency braking working condition respectively, random responses to the braking performance parameters in the digital twin model corresponding to the groups of the combined random parameters respectively under each of the specified working conditions, and then entering Step D;
Step D, taking, for each braking performance parameter respectively, according to the random responses to the braking performance parameters in the digital twin model corresponding to the groups of the combined random parameters respectively under each of the specified working conditions, the groups of the combined random parameters as an input, and the braking performance parameters corresponding to the groups of the combined random parameters respectively as an output, to construct a training data sample library corresponding to the braking performance parameters, and then entering Step E;
Step E, constructing, for the braking performance parameters respectively, according to the training data sample library corresponding to the braking performance parameters, model functions corresponding to the braking performance parameters respectively, wherein the model functions are used as random response surface models corresponding to the braking performance parameters respectively, and then entering Step F;

Step F, establishing, according to the random response surface models corresponding to the braking performance parameters respectively, in combination with a threshold value for each of the braking performance parameters corresponding to the target hoist brake, reliability evaluation models corresponding to the braking performance parameters respectively, and then entering step G;

Step G, performing, for a third data for the braking working condition parameters obtained by detecting the target hoist brake, according to the reliability evaluation models corresponding to the braking performance parameters respectively, a statistical moment analysis by adopting a knowable moment, further adopting a high-order moment approximation method based on the knowable moment to obtain reliability results corresponding to the braking performance parameters respectively, thereby obtaining a comprehensive reliability result, and then entering Step H after adjusting the braking working condition parameters for the target hoist brake when the comprehensive reliability result is lower than a preset safety threshold.

2. The intelligent reliability evaluation and service life prediction method for the kilometer deep well hoist brake according to claim 1, wherein in Step G, after the obtaining of the reliability results corresponding to the braking performance parameters respectively, according to a correlation among the braking performance parameters, a copula function is applied to establish a system reliability model under a correlation of a multi-failure mode for the reliability results thereby obtaining the comprehensive reliability result corresponding to the target hoist brake.

3. The intelligent reliability evaluation and service life prediction method for the kilometer deep well hoist brake according to claim 1, wherein the method further comprises:

Step I, acquiring, for a preset duration range in a direction from a current time to a historical time, a fourth data for the target hoist brake corresponding to the braking working condition parameters over time in the preset duration range and specifying a fifth data for second braking performance parameters related to performance degradation, and then entering Step II;

Step II, constructing, for each of the second braking performance parameters related to the performance degradation respectively, according to the fifth data for the second braking performance parameters of the target hoist brake related to the performance degradation over the time obtained in Step I, a degradation process model function as a performance degradation model corresponding to the second braking performance parameters related to the performance degradation;

further acquiring a plurality of performance degradation models corresponding to the second braking performance parameters related to the performance degradation respectively, and then entering Step III;

and Step III, acquiring, according to the plurality of performance degradation models corresponding to the second braking performance parameters related to the performance degradation respectively, for the fourth data for the braking working condition parameters obtained by detecting the target hoist brake, service life prediction results corresponding to the second braking performance parameters related to the performance degradation respectively;

wherein the Steps I to III are performed according to a second preset period duration based on the digital twin model to implement the service life prediction on the target hoist brake.

4. The intelligent reliability evaluation and service life prediction method for the kilometer deep well hoist brake according to claim 3, wherein in Step III, after acquiring the service life prediction results corresponding to the second braking performance parameters related to the performance degradation, a time-varying copula function is applied to establish a life prediction model under a correlation of a multi-degradation process for each of the life prediction results, thereby obtaining a comprehensive life prediction result corresponding to the target hoist brake.

5. The intelligent reliability evaluation and service life prediction method for the kilometer deep well hoist brake according to claim 3, wherein in Step E, a machine learning method is applied to the constructing of the model functions corresponding to the braking performance parameters, and then Step F is entered;

and in Step II, the machine learning method is applied to the constructing of the degradation process model function corresponding to the second braking performance parameters related to the performance degradation.

6. The intelligent reliability evaluation and service life prediction method for the kilometer deep well hoist brake according to claim 3, wherein the second braking performance parameters related to the performance degradation comprise a brake disc crack, a wear on the brake gate valve, and a stiffness of the belleville spring.

7. The intelligent reliability evaluation and service life prediction method for the kilometer deep well hoist brake according to claim 1, wherein Step ii comprises:

Step ii-1, obtaining, for the specified normal braking working condition and the specified emergency braking working condition respectively, the second braking torque generated by the second contact between the brake gate valve and the brake disc of the target hoist brake under each of the specified normal braking working condition and the specified emergency braking working condition, and then entering Step ii-2;

Step ii-2, obtaining, for the specified normal braking working condition and the specified emergency braking working condition as same as those in Step ii-1 respectively, the first braking torque generated by the first contact between the brake gate valve and the brake disc of the three-dimension-structural finite element simulation model under each of the specified normal braking working condition and the specified emergency braking working condition, and then entering Step ii-3;

Step ii-3, determining, for a second difference between the braking torque corresponding to the three-dimension-structural finite element simulation model and the braking torque corresponding to the target hoist brake under the specified normal braking working condition, as well as a third difference between the braking torque corresponding to the three-dimension-structural finite element simulation model and the braking torque corresponding to the target hoist brake under the specified emergency braking working condition, whether the second difference and the third difference are in a preset difference threshold range or not, wherein in response to the second difference and third difference being in the present difference threshold range, constituting, by the three-dimension-structural finite element simulation model, the digital twin model corresponding to the target hoist brake, else entering Step ii-4;

and Step ii-4, adjusting, according to the second difference and the third difference determined in the Step ii-3, parameters of the three-dimension-structural finite element simulation model as well as the physical action relations among the brake disc, the brake gate valve and the belleville spring, updating the three-dimension-structural finite element simulation model, and then returning to the Step ii-2.

8. The intelligent reliability evaluation and service life prediction method for the kilometer deep well hoist brake according to claim 1, wherein in the Step A, after the obtaining of the first data and the second data and before the mapping of the first data and the second data into the digital twin model, the second data is filtered.

9. The intelligent reliability evaluation and service life prediction method for the kilometer deep well hoist brake according to claim 1, wherein the braking working condition parameters comprise lifting loads, initial braking speeds, braking times and braking forces, and the braking performance parameters comprise a temperature of the brake disc, a temperature of the brake gate valve, a deformation of the brake disc, a wear losses of the brake gate valve, and a stiffness of the be belleville spring.

* * * * *